(12) United States Patent
Toshima et al.

(10) Patent No.: US 6,257,778 B1
(45) Date of Patent: Jul. 10, 2001

(54) METHOD FOR DEVELOPING FRONT SURFACE OF SUBSTRATE WITH IMPROVED DEVELOPING FUNCTION OF DEVELOPING SOLUTION AND APPARATUS THEREOF

(75) Inventors: Takayuki Toshima, Kita-koma-gun; Nobuo Konishi, Naka-koma-gun, both of (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/243,136

(22) Filed: Feb. 3, 1999

(30) Foreign Application Priority Data

Feb. 4, 1998 (JP) .................................................. 10-038147

(51) Int. Cl.$^7$ ...................................................... G03D 5/00
(52) U.S. Cl. .......................... 396/611; 118/320; 427/299; 430/323
(58) Field of Search ..................................... 396/604, 611, 396/627, 565, 572; 118/52, 320, 712; 134/2, 3, 4, 902, 153; 427/240, 299; 430/30, 5, 398, 399, 323

(56) References Cited

U.S. PATENT DOCUMENTS

| | | | |
|---|---|---|---|
| 5,626,913 | * | 5/1997 | Tomoeda et al. ..................... 427/299 |
| 6,000,862 | * | 12/1999 | Okuda et al. ......................... 396/611 |
| 6,033,475 | * | 3/2000 | Hasebe et al. ....................... 118/320 |

FOREIGN PATENT DOCUMENTS

| | | | |
|---|---|---|---|
| 63-175429 | * | 7/1988 | (JP) ..................................... 430/323 |
| 2-51160 | * | 2/1990 | (JP) . |
| 3-153019 | * | 7/1991 | (JP) ..................................... 438/796 |

* cited by examiner

Primary Examiner—D. Rutledge
(74) Attorney, Agent, or Firm—Oblon, Spivak, McClelland, Maier & Neustadt, P.C.

(57) ABSTRACT

When the surface of a substrate is developed, a developing solution in low state of development function is supplied to the surface of the substrate. Thereafter, the development function of the supplied developing solution is improved. Thus, the surface of the substrate is developed. When the developing solution is supplied to the surface of the substrate, the developing solution does not develop the surface of the substrate. Thus, even if there is a time lag of the developing solution supplied on the surface, the surface of the substrate is equally developed.

14 Claims, 11 Drawing Sheets

METHOD FOR DEVELOPING FRONT SURFACE OF SUBSTRATE WITH IMPROVED DEVELOPING FUNCTION OF DEVELOPING SOLUTION AND APPARATUS THEREOF

BACKGROUND OF THE INVENTION

1. Field of the Invention

The present invention relates to a method for developing the surface of a substrate that has been coated with resist and exposed with developing solution and to an apparatus thereof.

2. Description of the Related Art

A mask is formed by coating resist on the surface of a semiconductor wafer (hereinafter referred to as wafer), radiating a light beam, an electron beam, an ion beam, or the like to the resist surface, and developing the resist. With the mask, a circuit pattern is formed on the surface of the wafer. At the developing step, a light exposed portion or a non-light-exposed portion in the exposing step is dissolved with developing solution such as alkali solution.

At such a developing step, the wafer is vacuum-held on a spin chuck having a vacuum holding function. A supplying nozzle that has many discharging holes formed corresponding to the diameter of the wafer is positioned above the wafer. The developing solution is placed as a liquid membrane on the surface of the wafer through the discharging holes. While the developing solution is being supplied through the discharging holes, the wafer is turned by 180°.

Thus, the developing solution placed on the wafer spreads out. In addition, the developing solution is further supplied. Consequently, a membrane of the developing solution with a predetermined thickness is formed on the entire surface of the wafer.

At the developing step, the wafer is not rotated by more than 180°. This is because the former developing solution is prevented from mixing with the new developing solution. In other words, the wafer is prevented from being unequally developed between the mixed portion and non-mixed portion.

SUMMARY OF THE INVENTION

However, in the above-described developing method, to supply the developing solution on the entire surface of the wafer with a predetermined thickness, it takes around one to two seconds. Thus, a time lag takes place between a portion at which the developing solution is supplied early and a portion at which the developing solution is supplied later.

The progress of the developing process depends on the contact time of the process region of the wafer and the developing solution. In other words, the progress of the developing process is proportional to the contact time.

When there is a time lag of the supplied developing solution, the portion to which the developing solution is supplied earlier is more developed than the portion to which the developing solution is supplied later. Thus, in the above-described method, the surface of the wafer is unequally developed. Thus, it is difficult to equally develop the wafer.

An object of the present invention is to provide a developing method for equally developing the surface of a substrate and a development apparatus thereof.

To solve the above-described problem, a first aspect of the present invention is a method for developing the surface of a substrate, comprising the steps of supplying developing solution to the surface of the substrate, and improving the developing function of the supplied developing solution so as to develop the surface of the substrate.

A second aspect of the present invention is an apparatus for developing a substrate having a first surface and a second surface, comprising a holding portion for holding the substrate, supplying means for supplying developing solution to the first surface of the substrate held by the holding portion, and developing function improving means for improving the developing function of the developing solution supplied to the first surface.

According to the present invention, when developing solution is supplied to the surface of a substrate, it is not developed. After the developing function of the developing solution is improved, the substrate is developed. Thus, even if there is a time lag of developing solution supplied to the surface of the substrate, it is equally developed.

These and other objects, features and advantages of the present invention will become more apparent in light of the following detailed description of a best mode embodiment thereof, as illustrated in the accompanying drawings.

DESCRIPTION OF PREFERRED EMBODIMENTS

Figure 1:
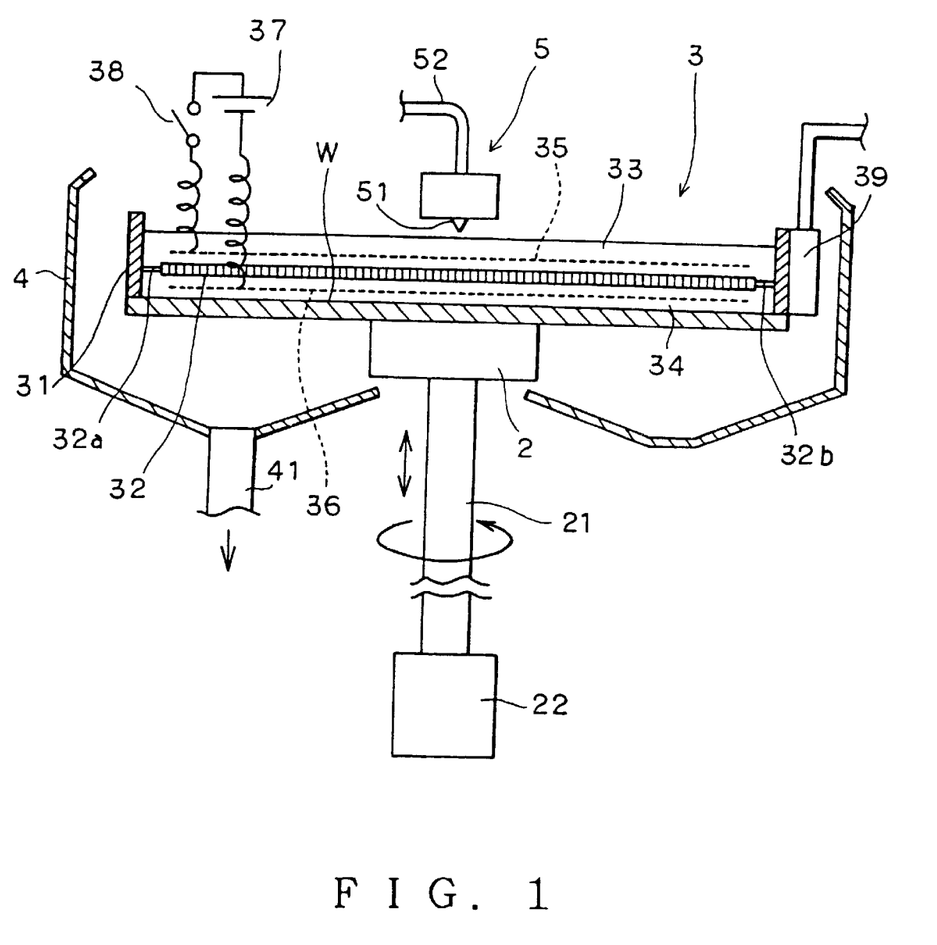
FIG. 1 is a sectional view showing the structure of a developing apparatus according to a first embodiment of the present invention.
Figure 2:
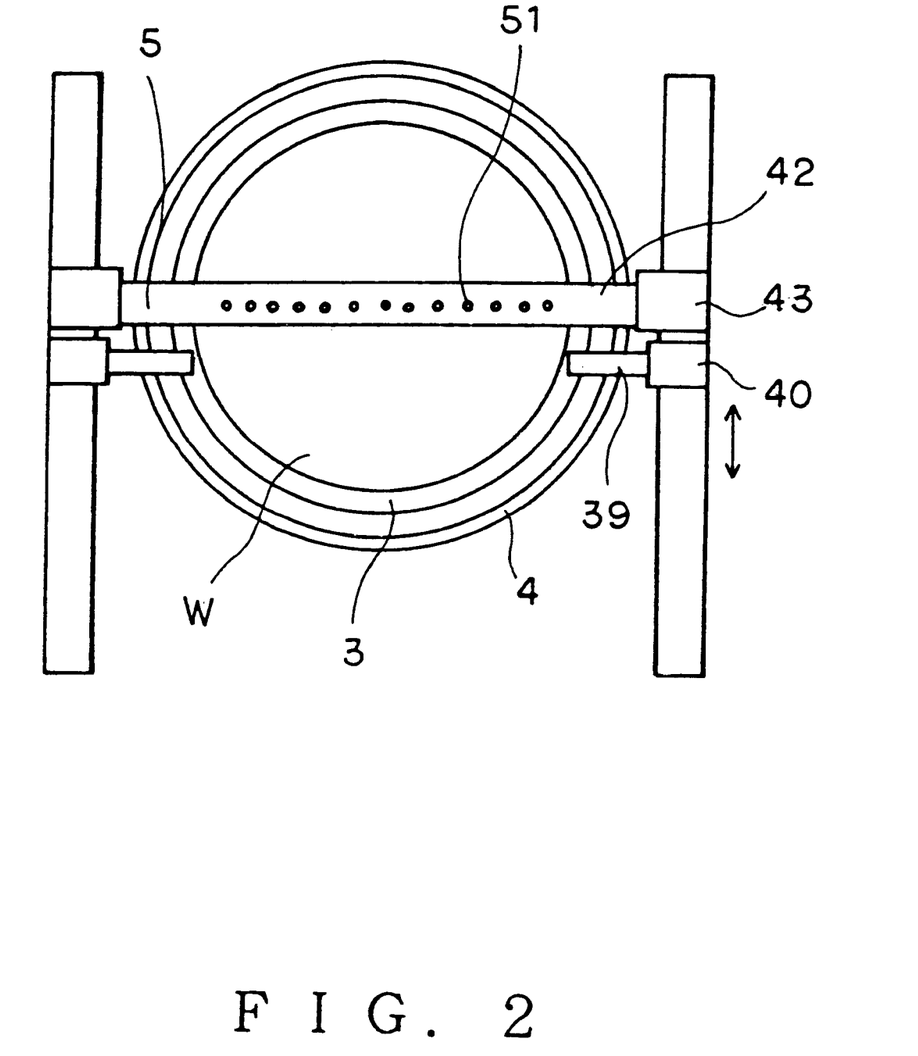
FIG. 2 is a plan view of the developing apparatus shown in FIG. 1.
Figure 3:
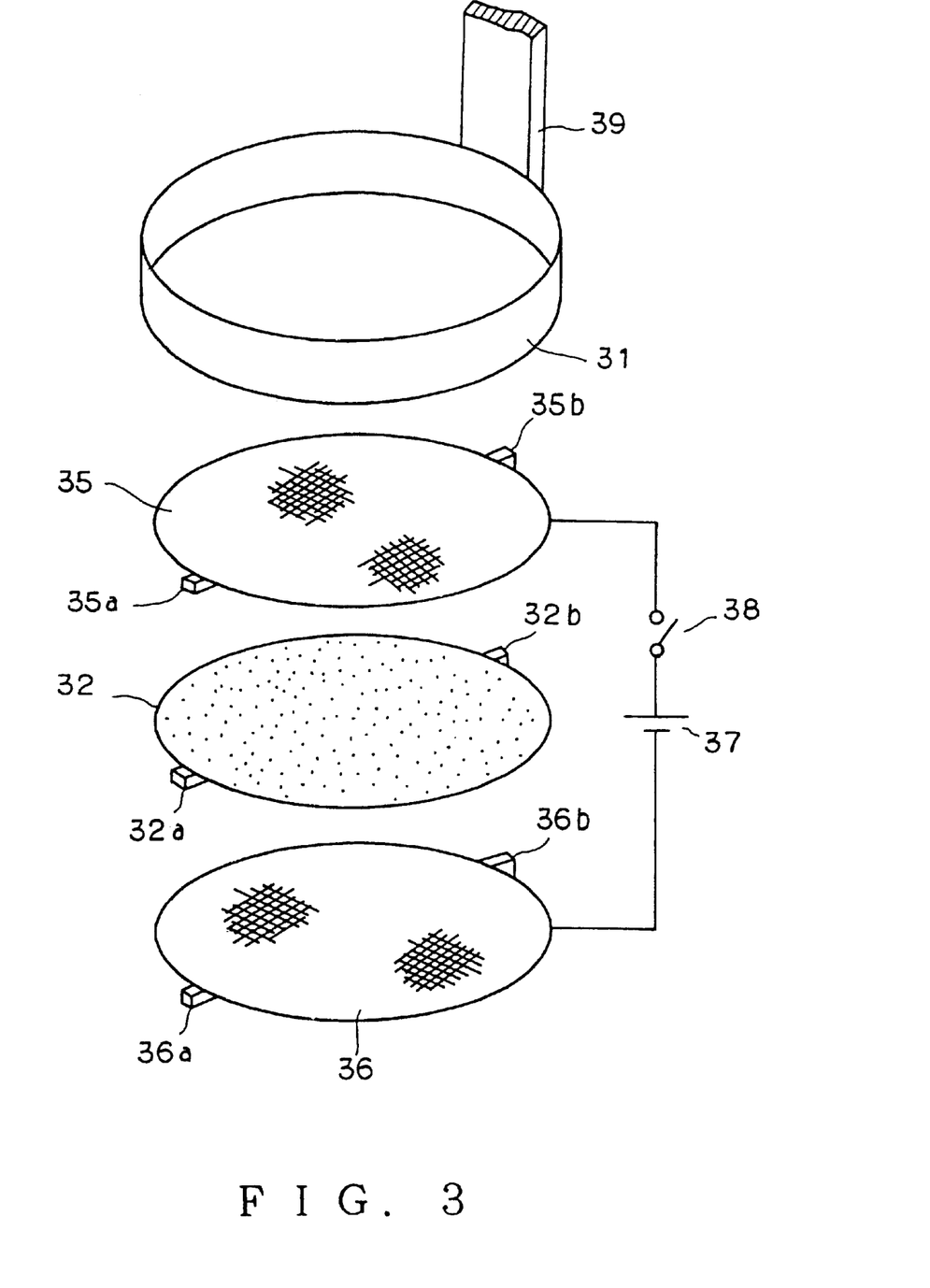
FIG. 3 is a perspective view showing an example of an electrolyzing unit disposed in the developing apparatus shown in FIG. 1.

FIG. 1 is a sectional view showing the structure of a liquid membrane forming apparatus according to a first embodiment of the present invention. FIG. 2 is a plan view shown in FIG. 1. FIG. 3 is a partial exploded perspective view shown in FIG. 1.

A wafer holding portion 2 horizontally or almost horizontally holds a substrate (for example, a wafer W) in such a manner that the surface thereof faces upwardly. In addition, the wafer holding portion 2 rotates the wafer W around the vertical axis. The wafer holding portion 2 is for example a vacuum chuck that vacuum-holds the wafer W. The wafer holding portion 2 is rotated and raised/lowered by a driving portion 22 through a vertical rotating shaft 21. The vertical rotating shaft 21 is connected to the rear surface of the wafer holding portion 2.

An electrolyzing unit 3 is disposed on the surface of the wafer W. A disc-shaped ion exchange membrane 32 is disposed in a cylindrical case 31 of the electrolyzing unit 3 in such a manner that the ion exchange membrane 32 faces the surface of the wafer W. An anode chamber 33 is formed above the ion exchange membrane 32 of the case 31. A cathode chamber 34 is formed below the ion exchange membrane 32 of the case 31. A disc-shaped anode 35 is disposed in the anode chamber 33 in such a manner that the anode 35 faces the surface of the wafer W. A disc-shaped cathode 36 is disposed in the cathode chamber 34 in such a manner that the cathode 36 faces the surface of the wafer W. The anode 35 and the cathode 36 are connected through a switch 38 and a power supply portion 37.

The ion exchange membrane 32 is composed of for example nitrocellulose. The ion exchange membrane 32 causes anions to selectively permeate. The anode 35 and the cathode 36 are composed of for example an aluminum mesh member.

The case 31 is disposed outside a process region of the wafer W in such a manner that the bottom surface of the case 31 almost contacts (does not contact) the peripheral portion of the surface of the wafer W. In this example, the outer periphery of the case 31 is positioned in the vicinity of the outer periphery of the wafer W. The inner periphery of the case 31 is positioned outside the process region of the wafer W.

The inner diameters of the ion exchange membrane 32, the anode 35, and the cathode 36 are slightly smaller than the inner diameter of the case 31. The ion exchange membrane 32, the anode 35, and the cathode 36 are secured to the inner wall of the case 31 with holding members 32a and 32b, holding members 35a and 35b, and holding members 36a and 36b, respectively. Thus, a small space is formed between the outer surface of each of the ion exchange membrane 32, the anode 35, and the cathode 36 and the inner wall of the case 31.

In this example, the cathode 36 is positioned around 0.5 mm above the surface of the wafer W. The ion exchange membrane 32 is positioned around 0.8 to 1.0 mm above the surface of the wafer W. The anode 35 is positioned around 1.3 to 2.0 mm above the front surface of the wafer W.

The case 31 is held by a holding member 39. The holding member 39 is disposed on the outer surface of the case 31. The case 31 is moved between a wafer W contact position and an outer standby position by a driving mechanism 40 through the holding member 39.

In this example, a fixed cup 4 is disposed around the wafer W and the electrolyzing unit 3 on the surface thereof in such a manner that the fixed cup 4 surrounds the side surfaces and bottom surfaces of the wafer W and the electrolyzing unit 3. A liquid draining path 41 is formed on the bottom surface of the fixed cup 4.

A supplying nozzle 5 is disposed above the electrolyzing unit 3 disposed on the surface of the wafer W. The supplying nozzle 5 supplies developing solution to the surface of the wafer W. Many discharging holes 51 are formed on the lower surface of the supplying nozzle 5 corresponding to the diameter of the wafer W. The developing solution supplied to the supplying nozzle 5 through a developing solution supplying pipe 52 is discharged to the surface of the wafer W through the discharging holes 51. The supplying nozzle 5 is held by a holding arm 42. The holding arm 42 is moved by a driving unit 43. Thus, the supplying nozzle 5 is moved between a supply position at the center portion on the surface of the wafer W and a standby position outside the wafer W.

Next, with reference to FIGS. 4 to 6, a liquid membrane forming method for the apparatus will be described.

Figure 4:
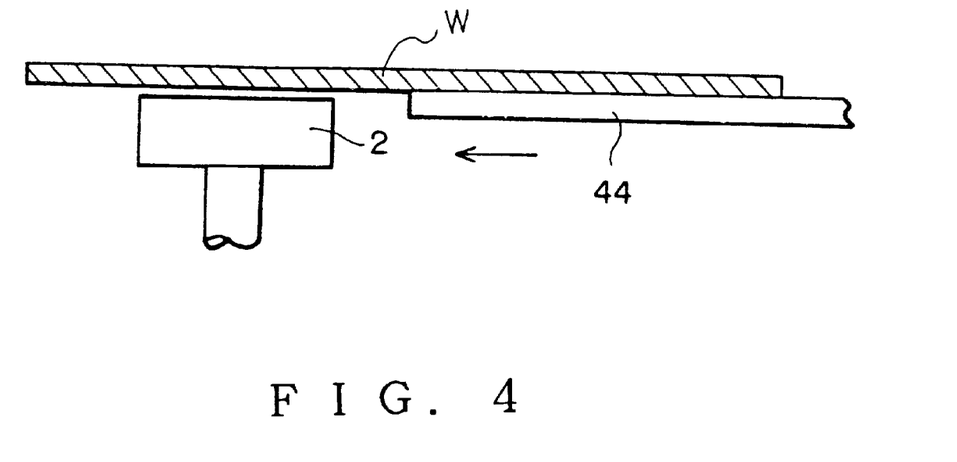
FIG. 4 is a sectional view for explaining the operation of the developing apparatus according to the first embodiment.

As shown in FIG. 4, the wafer holding portion 21 is raised. A wafer W that has been exposed is transferred from an upper position of the rotating cut 4 to the wafer holding portion 2 by a transferring arm 44 (not shown). Thereafter, the wafer holding portion 2 is lowered to the position shown in FIG. 1.

Figure 5:
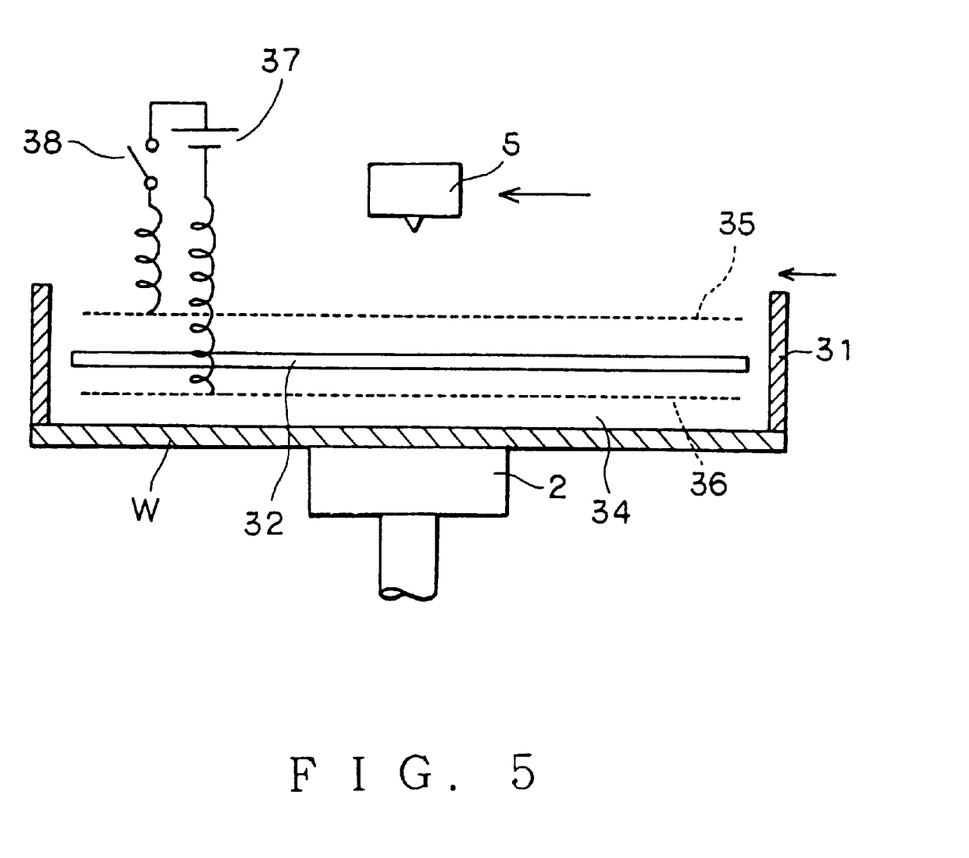
FIG. 5 is a sectional view for explaining the operation of the developing apparatus according to the first embodiment.

Next, as shown in FIG. 5, the electrolyzing unit 3 is moved from the standby position to the contact position of the surface of the wafer W. In addition, the supplying nozzle 5 is moved from the standby position to the supply position.

Figure 6:
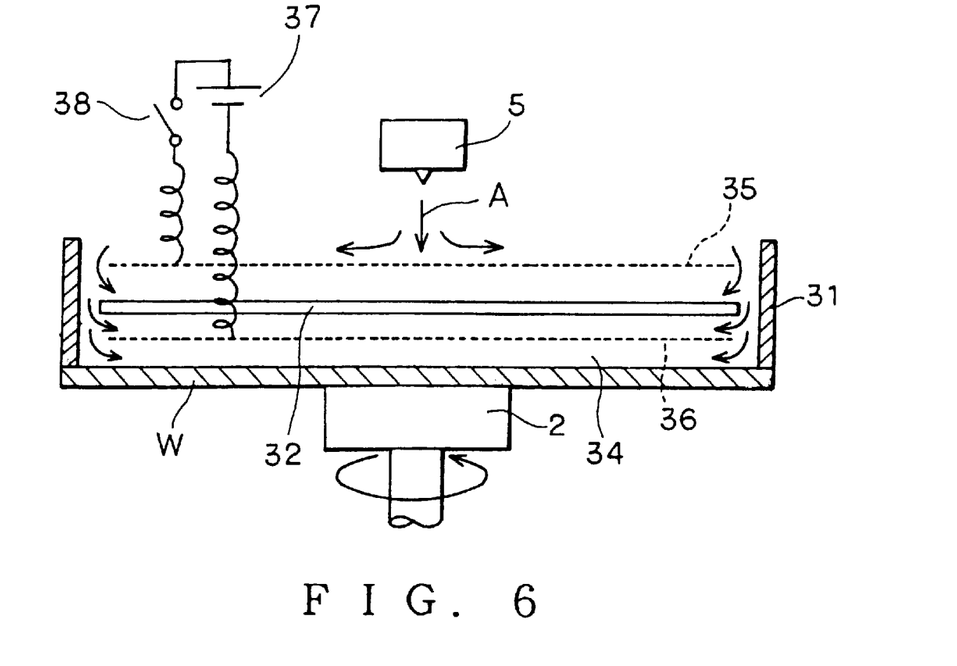
FIG. 6 is a sectional view for explaining the operation of the developing apparatus according to the first embodiment.

Thereafter, as shown in FIG. 6, while the wafer W is being rotated around the vertical axis by the wafer holding portion 2, developing solution A is supplied from the supplying nozzle 5 to the surface of the wafer W.

The developing solution A is for example 2.38 vol % TMAH (tetramethyl ammonium halide) solution. In this embodiment, the developing solution A is developing solution with low developing function (for example, TMAH solution with a concentration of which the developing process does not work, in other words, 1.19 to 1.59 vol % TMAH solution).

As denoted by arrows shown in FIG. 6, the supplied developing solution A downwardly flows through the mesh-shaped anode 35. In addition, the developing solution A flows from the center potion of the surface of the anode 35 to the peripheral portion thereof. Thereafter, the developing solution A downwardly flows from a space between the anode 35 and the case 31 to a lower space. The developing solution A spreads out between the anode 35 and the ion exchange membrane 32 and between the ion exchange membrane 32 and the cathode 36. Thus, the developing solution A flows to the wafer W through each space among the ion exchange membrane 32, the cathode 36, and the case 31 and through the cathode 36. In such a manner, the developing solution A is supplied until it covers the upper surface of the anode 35 of the electrolyzing unit 3. In addition, since the wafer W is rotated, the developing solution A supplied to the surface of the wafer W spreads out in the entire process region thereof.

At this point, since the wafer W and the electrolyzing unit 3 almost contact (but, do not contact), there is a small space between the wafer W and the electrolyzing unit 3 when the wafer W is rotated. However, the developing solution A does not leak out from the space due to surface expansion of the developing solution A. Even if the wafer W that is rotated contacts the electrolyzing unit 3, since the contacted portion is outside the process region, it does not adversely affect the developing process.

Figure 7:
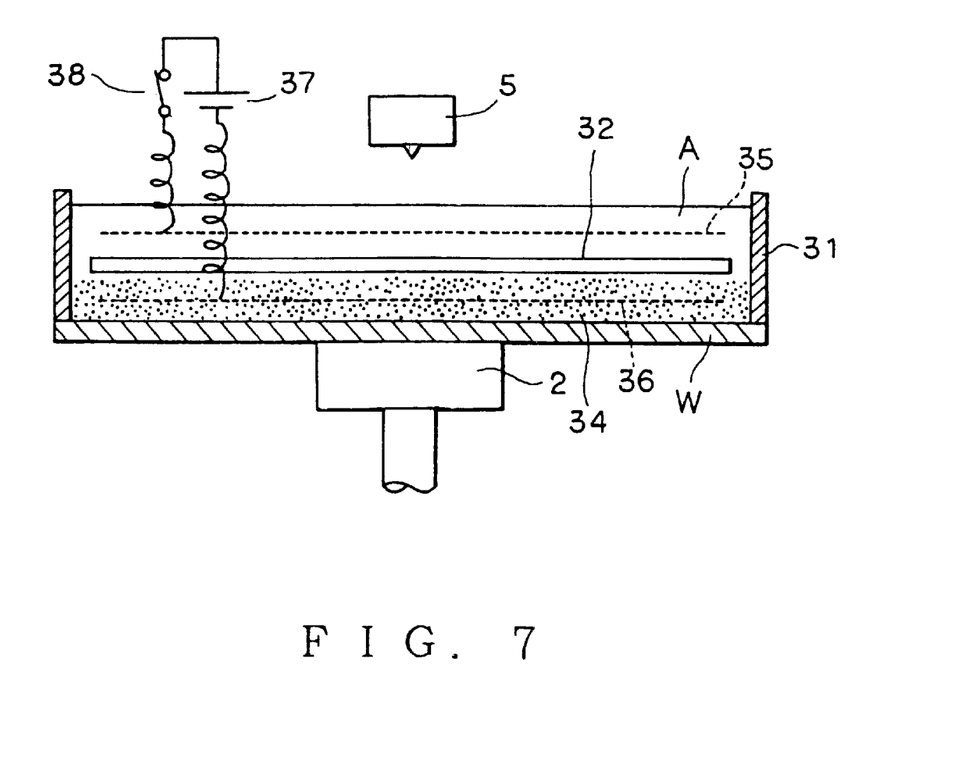
FIG. 7 is a sectional view for explaining the operation of the developing apparatus according to the first embodiment.

Next, as shown in FIG. 7, the rotation of the wafer W is stopped. Thereafter, the switch 38 is turned on so as to cause a current to flow between the anode 35 and the cathode 36. Thus, the electrolyzing process is started. Consequently, anions of the TMAH solution as developing solution move to the cathode chamber 34 through the ion exchange membrane 32. Thus, since the concentration of an alkali component of the TMAH solution in the cathode chamber 34 becomes high, the concentration of the TMAH solution becomes high. When the electrolyzing process is performed for a predetermined time period (for example, 0.5 minutes), the concentration of the TMAH solution in the cathode chamber 34 becomes around 2.38 vol %. Thus, the developing process works. After the developing process works, the switch 38 is turned off. Thus, the electrolyzing process is stopped. Thereafter, the developing process is performed for a predetermined time period. A light exposed portion or a non light exposed portion in the exposing process is dissolved with the TMAH solution.

Next, the electrolyzing unit 3 is raised from the wafer and moved to the standby position. At this point, a particular amount of the developing solution A flows from the space between the case 31 and the wafer W to the fixed cup 4. In addition, the supplying nozzle 5 is moved to the standby position. Thereafter, the wafer W is rotated at high speed so as to remove the remaining developing solution A on the surface of the wafer W by centrifugal force. Next, the wafer W is dried. The developing solution that flows to the fixed cup 4 is collected through the draining path 41.

In this embodiment, since the developing solution A is supplied with a concentration of which the developing process does not work, when the developing solution A is supplied, the developing process does not work. After the electrolyzing process is performed and thereby the concentration of the developing solution A in the cathode chamber 34 exceeds a predetermined value, the developing process works. In this embodiment, since the ion exchange membrane 32, the anode 35, and the cathode 36 are all disc-shaped and disposed in such a manner that they face the wafer W, the concentration of the developing solution A in the cathode chamber 34 equally increases on the surface of the wafer W. Thus, the surface of the wafer W is equally developed.

Thus, when the developing solution A is supplied to the surface of the wafer W, even if there is a time lag of the supplied developing solution A, the surface of the wafer W can be equally developed. Since the developing solution A with a low concentration is supplied, the consumption of the developing solution A can be reduced. Thus, the fabrication cost can be reduced.

Figure 8:
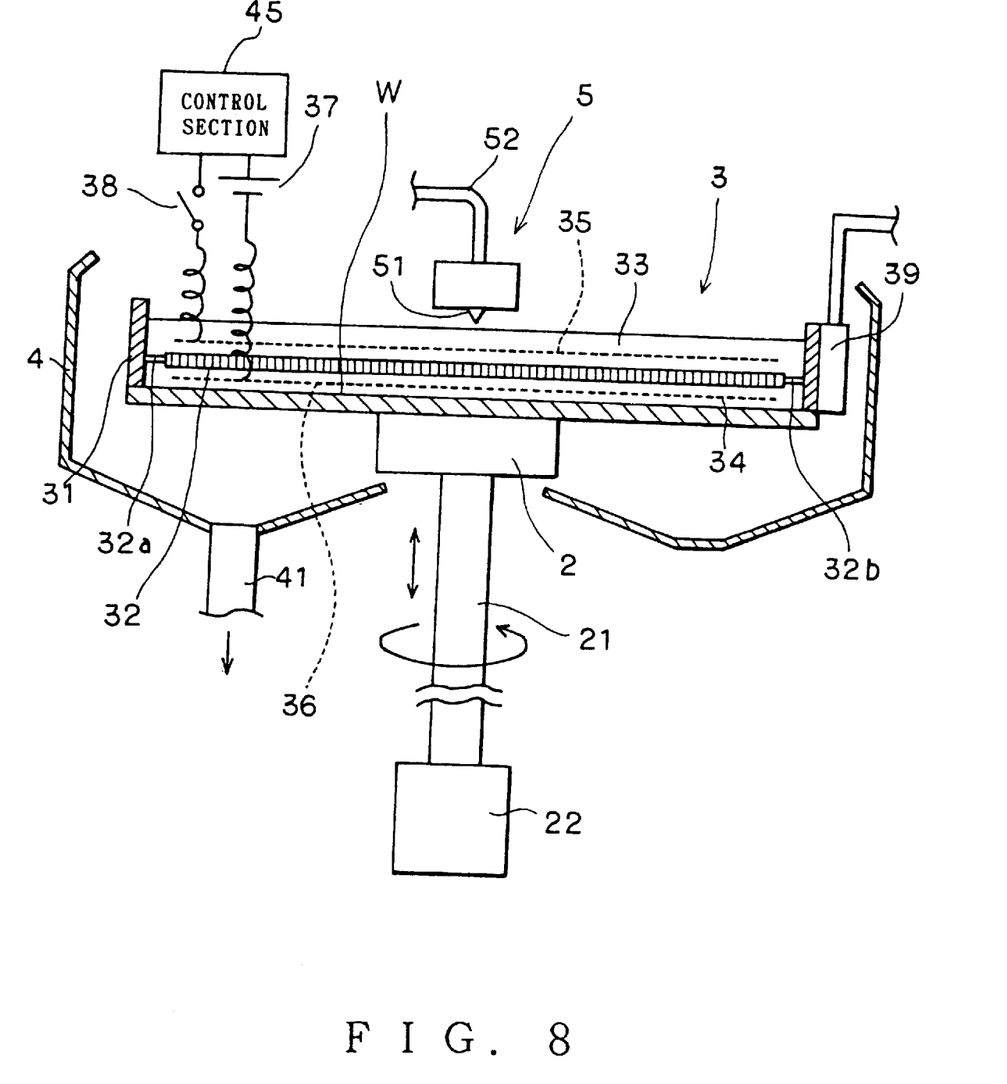
FIG. 8 is a sectional view showing the structure of a developing apparatus according to a second embodiment of the present invention.
Figure 9:
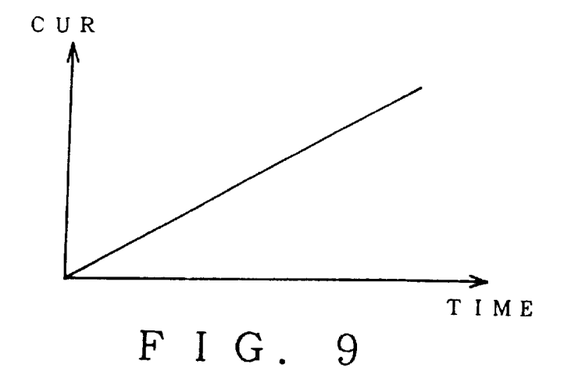
FIG. 9 is a graph showing a chronological variation of a current amount of an electrolyzing process of the developing apparatus according to the second embodiment.
Figure 10:
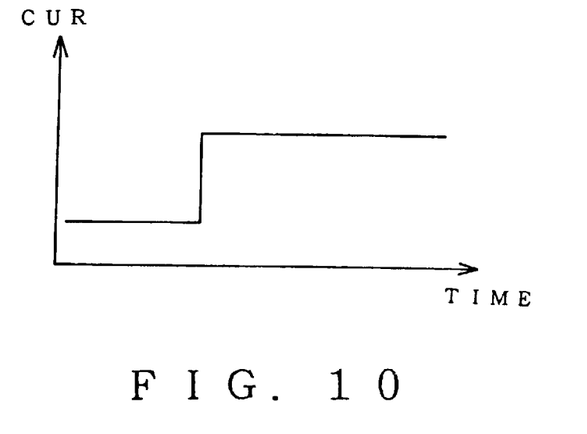
FIG. 10 is a graph showing a chronological variation of a current amount of an electrolyzing process of the developing apparatus according to the second embodiment.

FIG. 8 shows the structure of a second embodiment of the present invention. In FIG. 8, similar portions to those in FIG. 1 are denoted by similar reference numerals and their description will be omitted. As shown in FIG. 8, an anode 35 and a cathode 36 are connected through a switch 38, a power supply portion 37, and a controlling portion 45 that controls the flow of the current. For example, as shown in FIGS. 9 and 10, the current amount in an electrolyzing process is chronologically varied. In other words, at the beginning of the electrolyzing process, the current amount is low. Thereafter, the current amount is gradually increased. FIG. 9 shows an example of which the current amount is gradually increased. FIG. 10 shows an example of which the current amount is increased in stages.

Figure 11:
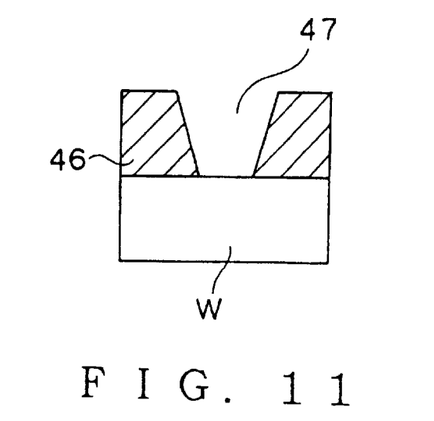
FIG. 11 is a schematic diagram for explaining an effect of the developing apparatus according to the second embodiment.

In this case, the sharpness of a concave portion of a circuit pattern on the wafer W improves. When the current amount in the electrolyzing process is initially large and the concentration of the developing solution is sharply increased, after a circuit pattern is developed and a resist 46 on the wafer W is removed, a concave portion 47 becomes dull. To prevent this problem, the current amount should be increased to a particular value. However, in this case, the sharpness of the concave portion 47 may deteriorate in the exposing process. In other words, when light is not properly focused in the exposing process, the lower portion of the concave portion 47 is not sufficiently exposed. Thus, the lower portion of the concave portion 47 becomes narrow in the developing process.

Figure 12:
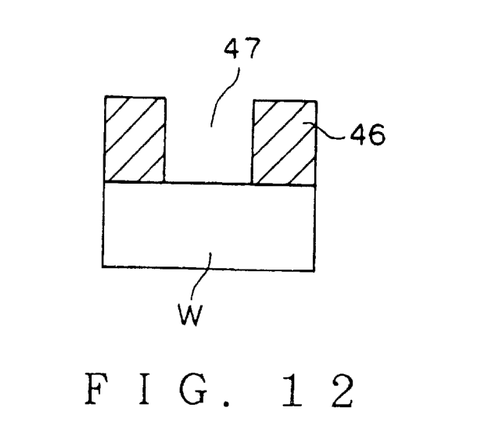
FIG. 12 is a schematic diagram for explaining an effect of the developing apparatus according to the second embodiment.

As with the above-described example, when the current amount is gradually increased in the developing process and thereby the concentration of the developing solution is gradually increased, the developing force (dissolving force) is gradually increased. Thus, when the lower portion of the concave portion 47 is dissolved, the dissolving force becomes large. Consequently, the lower portion of the concave portion 47 can be sufficiently dissolved. As a result, as shown in FIG. 12, the sharpness of the concave portion 47 improves.

In the second embodiment, the mesh densities of the mesh portions of the anode 35 and the cathode 36 may be varied in the horizontal direction. In this case, the developing force can be varied on the plane of the wafer.

Next, a third embodiment of the present invention will be described.

Figure 13:
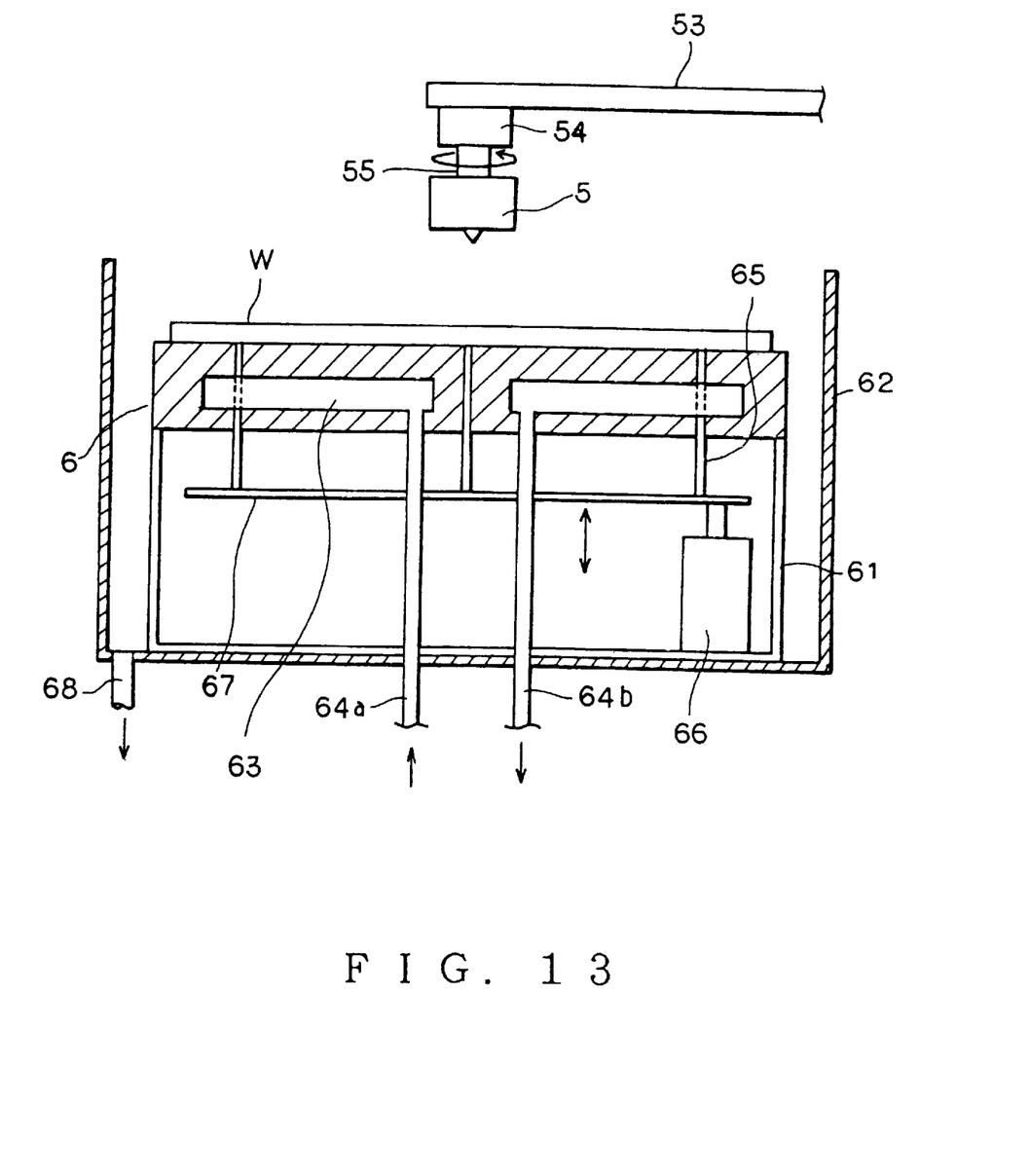
FIG. 13 is a sectional view showing the structure of a developing apparatus according to a third embodiment of the present invention.

FIG. 13 is a sectional view showing the structure of a liquid membrane forming apparatus according to the third embodiment.

A holding table 6 horizontally holds a substrate (for example, a wafer W) in such a manner that the surface of the wafer W upwardly faces. The holding table 6 is held by a cylindrical holding member 61. The holding member 61 is disposed below the holding table 6. The holding table 6 and the holding member 61 are disposed in a top-opened case 62. Thus, the holding table 6 and the holding member 61 are surrounded by the case 62.

A flow path 63 that allows temperature adjustment solution to flow is formed in the holding table 6. A temperature adjustment solution supplying pipe 64a and a temperature adjustment solution draining pipe 64b are connected to the flow path 63. The temperature adjustment solution supplying pipe 64 supplies the temperature adjustment solution to the flow path 63. The temperature adjustment solution draining pipe 64b drains the temperature adjustment solution from the flow path 63.

For example three rising pins 65 protrude from the upper surface of the holding table 6. The rising pins 65 are raised/lowered by a raising/lowering portion 66 through a table frame 67. The raising/lowering portion 66 is disposed in the holding member 61. A liquid draining path 68 is connected to a bottom portion of the case 62.

A supplying nozzle 5 is disposed above the surface of the wafer W placed on the holding table 6. The supplying nozzle 5 supplies developing solution to the surface of the wafer W.

The supplying nozzle 5 is rotated around a vertical rotating shaft 55 by a rotating mechanism 54 disposed on a supporting arm 53. A developing solution supplying pipe (not shown) is disposed in the supporting arm 53. The other structure of the supplying nozzle 5 shown in FIG. 13 is the same as that shown in FIG. 1. The supplying nozzle 5 is moved between a supply position (shown in FIG. 13) at which the developing solution is supplied to the center portion of the surface of the wafer W and a standby position outside the wafer W by the supporting arm 53.

Figure 14:
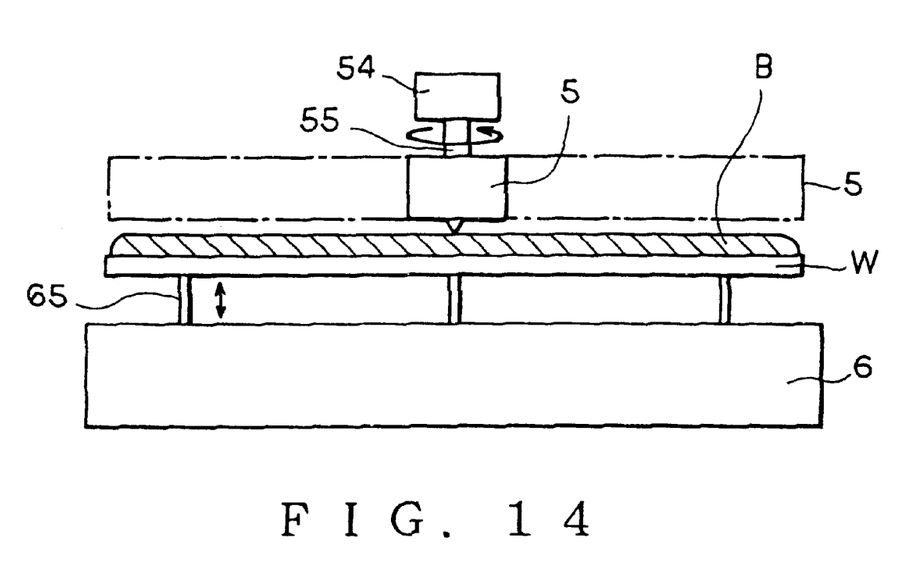
FIG. 14 is a sectional view for explaining the operation of the developing apparatus according to the third embodiment.

In this apparatus, the rising pins 65 are raised from the upper surface of the holding table 6. A wafer W that has been exposed at a position shown in FIG. 14 is transferred to the rising pins 65 by a transferring arm. After the wafer W is placed to the position, the supplying nozzle 5 is moved from the standby position to the supply position. Thereafter, developing solution B (for example, 1.59 vol % TMAH solution) is supplied from the supplying nozzle 5 to the surface of the wafer W. This process is performed at a room temperature (for example, 23° C.). When the developing solution B is supplied, the temperature of the surface of the wafer W is at around 30° C. (at which the developing process does not work).

At this point, the developing solution B is supplied to the center portion of the surface of the wafer W. Thereafter, while the supplying nozzle 5 is being rotated by a half turn (180°), the developing solution B is supplied. Thus, since the supplying nozzle 5 has many discharging holes 51 along the diameter of the wafer W, the developing solution B is supplied to the entire process region on the surface of the wafer W.

Figure 15:
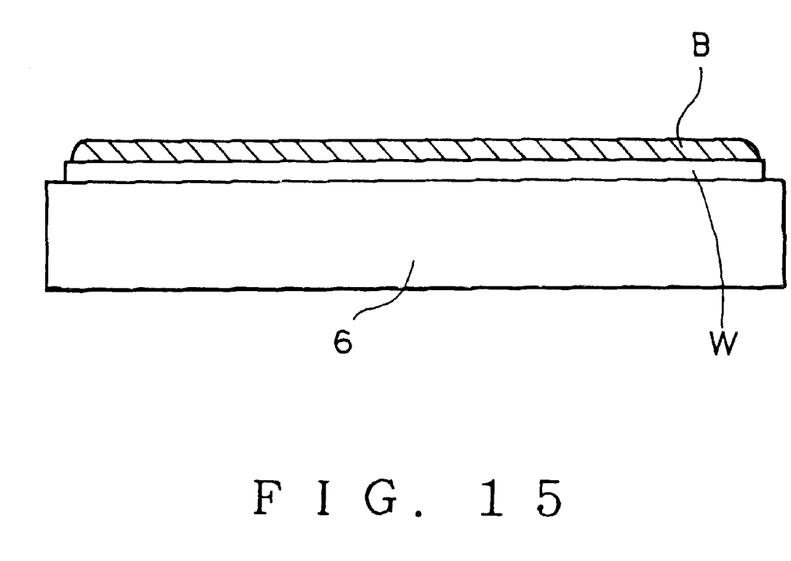
FIG. 15 is a sectional view for explaining the operation of the developing apparatus according to the third embodiment.

On the other hand, temperature adjustment solution (for example, cooling water) is circulated to the holding table 6. The temperature of the upper surface of the holding table 6 is maintained at a temperature of which the developing solution B becomes active (for example, this temperature is 15° C.). Thereafter, as shown in FIG. 15, the rising pins 65 are lowered and the wafer W is transferred to the holding table 6. At this point, since the temperature of the upper surface of the holding table 6 is lower than the temperature of the wafer W, the upper surface of the holding table 6 operates as a cooling plate and thereby the holding table 6 absorbs heat of the wafer W. Thus, the temperature of the surface of the wafer W is cooled to around 15° C. In addition, the temperature of the developing solution B on the surface of the wafer W is cooled to around 15° C.

It is known that the developing process of the TMAH solution works at around 15° C. Thus, when around 1.59 vol % TMAH solution that is thinner than conventional 2.38 vol % TMAH solution is used, although the developing process does not work at a room temperature, it works at around 15° C. In other words, when the developing solution B is cooled by the holding table 6 through the wafer W, when the temperature of the developing solution B drops to around 15° C., the developing process works.

After the developing process has been performed for a predetermined time period controlling the developing solution B at a temperature of around 15° C., the wafer W is raised from the holding table 6 by the rising pins 65. Thus, the developing process is completed. Thereafter, the wafer W is transferred to a drying unit (not shown) by the transferring arm. In the drying unit, the wafer W is rotated at high speed and thereby dried. The developing solution that has been used in the developing process and that has leaked out to the case 62 is collected through the liquid draining path 68 when the wafer W is transferred.

In the third embodiment, when the developing solution B is supplied, the developing process does not work. After the temperature of the developing solution B is cooled to a predetermined temperature, the developing process works. At this point, since the developing solution B is cooled through the wafer W, the temperature of the developing solution B is lowered almost equally on the surface of the wafer W. Thus, the developing process is equally performed on the surface of the wafer W. Consequently, when the developing solution B is supplied to the surface of the wafer W, even if there is a time lag of the developing solution B supplied to the surface of the wafer W, the developing process can be equally performed. In this example, since the concentration of the developing solution B is lower than the concentration of the conventional developing solution, the consumption of the developing solution B can be reduced.

Next, a forth embodiment of the present invention will be described.

Figure 16:
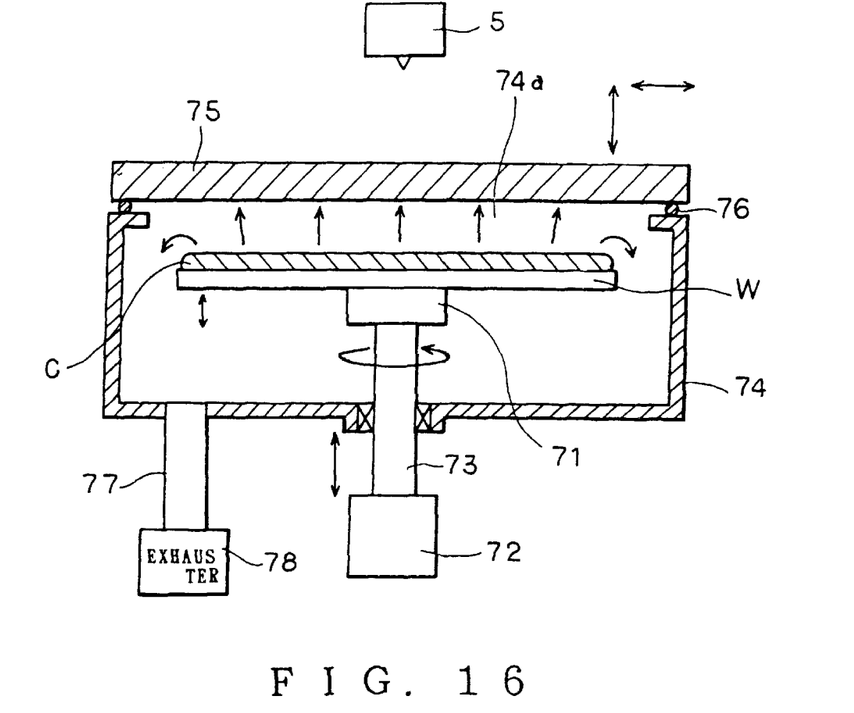
FIG. 16 is a sectional view showing the structure of a developing apparatus according to a fourth embodiment of the present invention.

FIG. 16 is a sectional view showing the structure of a liquid membrane forming apparatus according to the fourth embodiment A wafer holding portion 71 horizontally holds a substrate (for example, a wafer W) in such a manner that the wafer W upwardly faces. For example, the wafer holding portion 71 is a vacuum chuck. The wafer holding portion 71 is raised/lowered and rotated by a driving portion 72 through a rotating shaft 73.

A fixed cup 74 is disposed in such a manner that it surround a side surface and a lower surface of the wafer holding portion 71. An opening portion 74a is formed in the fixed cup 74 in such a manner that the wafer W moves in the opening portion 74a. The opening portion 74a is securely closed by a lid 75 through a sealing member 76. When the opening portion 74a is closed by the lid 75, an closed process space S is formed in the fixed cup 74. An exhausting unit 78 is connected to the bottom surface of the fixed cup 74 through an exhausting pipe 77.

The lid 75 is raised/lowered and horizontally moved between a close position at which the opening portion 74a is closed and a standby position outside the fixed cup 74 by a moving mechanism (not shown). The structure of a supplying nozzle 5 that supplies developing solution to the wafer W is the same as that of the supplying nozzle of the liquid membrane forming apparatus shown in FIG. 1.

Figure 17:
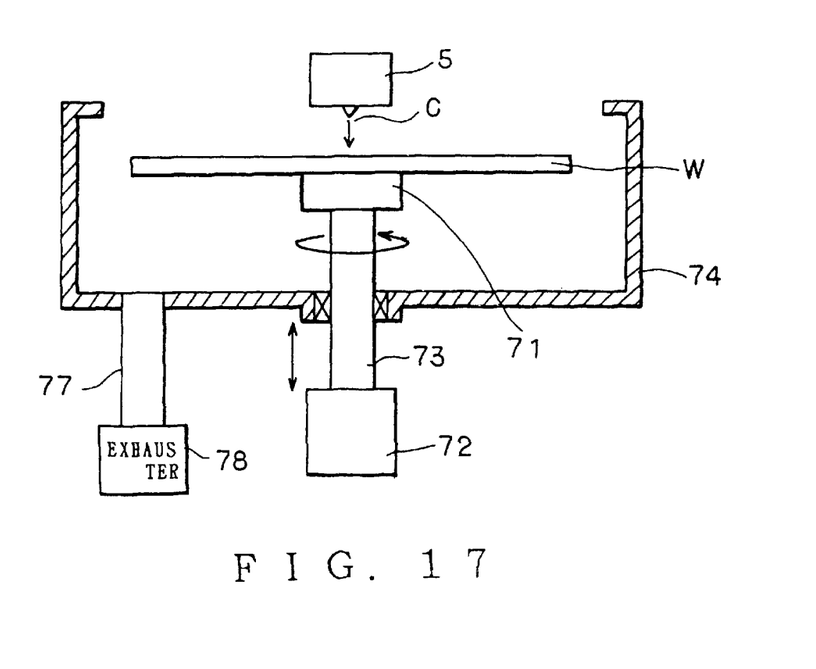
FIG. 17 is a sectional view for explaining the operation of the developing apparatus according to the fourth embodiment.

In the state that the lid 75 is open, the wafer holding portion 71 is raised to an upper position of the fixed cup 74. A wafer W that has been exposed is transferred to the wafer holding portion 71 by a transferring arm (not shown). The holding portion 71 is lowered to a process position. As shown in FIG. 17, the supplying nozzle 5 is moved from the standby position to the supply position. Developing solution C (for example, 1.59 vol % TMAH solution) is supplied to a center portion of the surface of the wafer W. At this point, the developing solution C is supplied to the center portion of the surface of the wafer W. Thereafter, while the wafer W is being rotated by a half turn, the developing solution C is supplied. Thus, the developing solution C is supplied to the entire process region of the surface of the wafer W.

Next, as shown in FIG. 16, after the process space C is securely closed by the lid 75, the process space S is exhausted by the exhausting unit 78 through an exhausting pipe 77. Thus, since the pressure in the process space S gradually lowers, the boiling point of the developing solution C lowers. Thus, moisture contained in the developing solution C gradually evaporates. Consequently, the concentration of the developing solution C gradually increases.

As a result, when the process space S is exhausted for a predetermined time period, the concentration of the developing solution C (namely, TMAH solution) becomes around 2.38 vol %. Thus, the developing process works. After the developing process works, the exhausting operation is stopped. In this state, the developing process is performed for a predetermined time period. Thereafter, the lid 75 is opened. The process space S is restored to normal pressure. The wafer W is rotated at high speed and thereby dried.

In this embodiment, when the developing solution C is supplied, the developing process does not work. When the concentration of the developing solution C increases, the developing process works. Since the concentration of the developing solution C increases almost equally on the surface of the wafer W, the surface of the wafer W is equally developed. Thus, when the developing solution C is supplied to the surface of the wafer W, even if a time lag of the supplied developing solution C takes place on the surface of the wafer W, it can be equally developed. In this example, since the concentration of the developing solution C supplied to the surface of the wafer W is low, the consumption of the developing solution C can be reduced.

Figure 18:
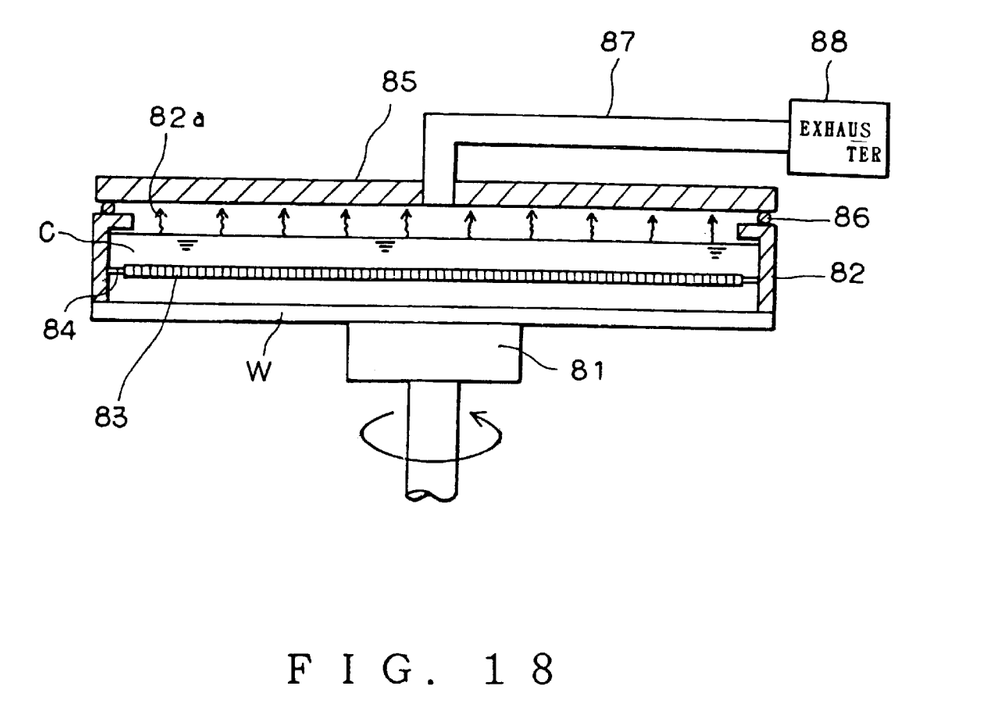
FIG. 18 is a sectional view showing the structure of a developing apparatus according to a fifth embodiment of the present invention.

FIG. 18 shows the structure of a fifth embodiment of the present invention. In FIG. 18, reference numeral 81 is a wafer holding portion that horizontally holds a wafer W in such a manner that the surface thereof upwardly faces. The wafer holding portion 81 is rotated around a vertical axis. Reference numeral 82 is a case disposed outside a process region of the surface of the wafer W. The bottom surface of the case 82 almost contacts (but, does not contact) the peripheral portion of the surface of the wafer W.

A disc-shaped permeable membrane 83 is disposed in the case 82 in such a manner that the permeable membrane 83 faces the surface of the wafer W. The inner diameter of the permeable membrane 83 is slightly smaller than the inner diameter of the case 82. The permeable membrane 83 is secured to the inner wall of the case 82 with two holding members 84. An opening portion 82a is formed above the case 82. The opening portion 82a is securely closed by a lid 85 through a sealing member 86. Thus, when the opening portion 82a is closed with the lid 85, the inside of the case is securely closed. In addition, an exhausting unit 88 is connected to the lid 85 through an exhausting pipe 87.

In this apparatus, after the wafer W that has been exposed is held by the wafer holding portion 81, the case 82 is approached to the surface of the wafer W. While the wafer W is being rotated by a half turn, the developing solution C (for example, 1.59 vol % TMAH solution) is supplied from a supplying nozzle 5 disposed above the case 82 to a center portion of the surface of the wafer W. After the lid 85 is closed, the inside of the case 82 is exhausted. Thus, since moisture contained in the developing solution C evaporates, the surface of the wafer W is developed. In this example, when the developing solution C is supplied, since the developing process does not work, the wafer W is not developed. When the concentration of the developing solution C increases, the developing process works. Thus, in this embodiment, the same effects as the above-described embodiments can be obtained.

According to the present invention, a step for improving a developing function of developing solution and thereby performing a developing process may be performed by electrolyzing the developing solution and evaporating moisture contained therein. In this case, the time period for improving the developing function can be reduced. In addition, the concentration of the developing solution can be easily controlled. Alternatively, the developing process may be performed by electrolyzing the developing solution, evaporating moisture of the developing solution, and adjusting the temperature of the developing solution. In this case, the time period for improving the developing function can be further shortened. In addition, the concentration of the developing solution becomes equal on the entire front surface of the substrate.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A method for developing a surface of a substrate, comprising the steps of:

(a) supplying a developing solution to the surface of the substrate; and (b) improving a developing function of the supplied developing solution so as to develop the surface of the substrate, wherein the developing solution is comprised of an alkali solution, wherein the step (a) includes the step of:

supplying developing solution with a low concentration to the surface of the substrate, the low concentration at least almost not allowing the developing solution to develop the surface of the substrate, wherein the step (b) includes the step of:

increasing the concentration of the developing solution supplied to the surface of the substrate developing the surface therewith, and wherein the concentration increasing step includes the step of:

electrolyzing the developing solution.

2. The method as set forth in claim 1, wherein the concentration increasing step includes the step of:

continuously increasing a current amount for electrolyzing the developing solution.

3. The method as set forth in claim 1, wherein the concentration increasing step includes the step of:

increasing the current amount for electrolyzing the developing solution in stages.

4. A method for developing a surface of a substrate, comprising the steps of:

(a) supplying a developing solution to the surface of the substrate; and (b) improving a developing function of the supplied developing solution so as to develop the surface of the substrate, wherein the developing function improving step includes the step of:

evaporating moisture contained in the developing solution.

5. The method as set forth in claim 4, wherein the evaporating step includes the step of:

decreasing a pressure of a atmosphere in an environment of the substrate.

6. A method for developing a surface of a substrate, comprising the steps of:

(a) supplying a developing solution to the surface of the substrate; and (b) improving a developing function of the supplied developing solution so as to develop the surface of the substrate, wherein the developing solution is composed of an alkali solution, wherein the step (a) includes the step of:

supplying the developing solution at a particular temperature to the surface of the substrate, the particular temperature at least almost not allowing the developing solution to develop the surface of the substrate, and wherein the step (b) includes the step of:

adjusting the temperature of the developing solution supplied to the surface of the substrate to a particular temperature, the particular temperature allowing the developing solution to develop the surface of the substrate, and developing the surface of the substrate with the developing solution at the particular temperature.

7. The method as set forth in claim 6, wherein the temperature adjusting and developing step includes the step of:

cooling the developing solution supplied to the surface of the substrate.

8. An apparatus for developing a substrate having a first surface and a second surface, comprising:

a holding portion for holding the substrate;

supplying means for supplying a developing solution to the first surface of the substrate held by said holding portion; and developing function improving means for improving the developing function of the developing solution supplied to the first surface, wherein said supplying means supplies an alkali developing solution with a particular concentration to the first surface, the particular concentration at least almost not allowing the developing solution to develop the first surface, wherein said developing function improving means increases the concentration of the developing solution supplied to the first surface and develops the first surface, wherein said developing function improving means includes:

means for causing a current to flow in the developing solution and electrolyzing the developing solution.

9. The apparatus as set forth in claim 8, further comprising:

means for continuously increasing the current that flows in the developing solution.

10. The apparatus as set forth in claim 8, further comprising:

means for increasing the current that flows in the developing solution in stages.

11. An apparatus for developing a substrate having a first surface and a second surface, comprising:

a holding portion for holding the substrate;

supplying means for supplying a developing solution to the first surface of the substrate held by said holding portion; and developing function improving means for improving the developing function of the developing solution supplied to the first surface, wherein said developing function improving means includes:

means for evaporating moisture contained in the developing solution.

12. The apparatus as set forth in claim 11, wherein said moisture evaporating means decreases the pressure of the atmosphere in the environment of the substrate so as to evaporate moisture contained in the developing solution.

13. An apparatus for developing a substrate having a first surface and a second surface, comprising:

a holding portion for holding the substrate;

supplying means for supplying a developing solution to the first surface of the substrate held by said holding portion; and developing function improving means for improving the developing function of the developing solution supplied to the first surface, wherein said supplying means supplies alkali developing solution at a particular temperature to the first surface, the particular temperature at least almost not allowing the developing solution to develop the first surface, and wherein said developing function improving means adjusts the temperature of the developing solution supplied to the first surface to a particular temperature, the particular temperature allowing the developing solution to develop the first surface of the substrate.

14. The apparatus as set forth in claim 13, wherein said developing function improving means includes:

cooling means for cooling the developing solution supplied to the first surface of the substrate.

* * * * *

UNITED STATES PATENT AND TRADEMARK OFFICE
CERTIFICATE OF CORRECTION

PATENT NO.    : 6,257,778 B1                                                      Page 1 of 1
DATED         : July 10, 2001
INVENTOR(S)   : Takayuki Toshima et al.

It is certified that error appears in the above-identified patent and that said Letters Patent is hereby corrected as shown below:

<u>Title page,</u>
Item [56], References Cited, FOREIGN PATENT DOCUMENTS, please add
-- 2-189917 * 07/90 (JP) --

Signed and Sealed this

Twenty-ninth Day of October, 2002

*Attest:*

*Attesting Officer*

JAMES E. ROGAN
*Director of the United States Patent and Trademark Office*